METALLIZING COMPOSITION CONDUCTOR AND METHOD

Filed Nov. 29, 1966

INVENTORS
STEPHEN A. MILKOVICH
LEWIS F. MILLER

BY Joseph L. Spiegel
ATTORNEY

United States Patent Office 3,537,892
Patented Nov. 3, 1970

3,537,892
METALLIZING COMPOSITION CONDUCTOR AND METHOD

Stephen A. Milkovich, Beacon, and Lewis F. Miller, Wappingers Falls, N.Y., assignors to International Business Machines Corporation, Armonk, N.Y., a corporation of New York Filed Nov. 29, 1966, Ser. No. 597,621
Int. Cl. B44d *1/18;* C09d *5/24;* H01b *1/02*
U.S. Cl. 117—227 8 Claims

ABSTRACT OF THE DISCLOSURE

A conductive metallizing composition adapted to be deposited and fired at 725–900° C. on an insulating substrate to form a conductive element thereon comprises: a metal component comprising 60–70% gold, 10–20% platinum and 10–30% palladium; a vitreous frit component; and, a vehicle.

The present invention relates to metallizing compositions, and in particular to conductive metallizing compositions to be used in forming electrically conductive contacts, land patterns and the like of microminiature circuit modules.

The microminiaturized circuit module is typically a miniature square substrate of only a fraction of an inch in thickness, having functional components on its surface electrically connected with printed wiring. The functional components are devices which include one or more active or passive electric circuit elements fabricated as an integrated structure and capable of performing useful functions or operations. The active devices, as one example, secured to the substrate are generally in the order of 25–200 mils square. The printed conductive elements or wiring between the active and passive devices are in width 4 to 15 mils or less and in thickness 0.5 to 1.5 mils.

The small cross-section of the printed conductor element and its necessary closeness to the high-precision passive and active functional components present severe limitations on the metallizing composition to be used in such conductive elements. A major requirement is that the composition be highly and uniformly conductive because of the small cross-section of the to be formed element. The composition should also possess good screenability characteristics and a long shelf life. Another important aspect is that the composition not be subject to cracking or fissuring during the sintering step in its formation into a conductive element. Finally, the conductive element so formed should be reliably tinned, dense, and have good adhesion-to-substrate characteristics.

In some instances, conductive elements formed from such compositions are also characterized by migration of a portion of the metal component. For example, under conditions of high humidity and voltage, silver can plate out on cathodic regions of the circuit, ultimately forming dendrites which can travel to and electrically short out on adjacent anodic regions.

Thus, it is an object of the present invention to provide a metallizing composition from which fired-on conductive elements may be formed, the conductive elements so formed being characterized generally by high adhesiveness, density and reproducibility, high and uniform conductivity, low interaction with solders and absence of metal migration.

Another object is a non-silver bearing conductive composition which is not subject to cracking or fissuring during sintering.

Still another object is such a composition which when fired on a substrate provides a readily solderable conductive element which is not susceptible to erosion or leaching by the solder.

In accordance with the present invention there is provided a metallizing composition for the production of fired-on, conductive elements comprising: a metal component composed of gold, platinum and palladium; a vitreous frit component, and a vehicle.

The metal component should comprise from 60 to 70% gold, from 10 to 20% platinum and from 10 to 30% palladium, all in parts by weight.

Very satisfactory results are obtained with a composition as described above in which the metal component is composed of 60% gold, 20% platinum and 20% palladium.

The conductive element is formed on a dielectric substrate by mixing powders of these noble metals and a finely divided vitreous frit with an inert liquid vehicle to produce a homogeneous paste. This is accomplished by first sifting the noble metal particles and vitreous frit through a very fine mesh screen and mixing until completely homogeneous. The particles and vitreous frit are then dispersed in an organic vehicle until a homogeneous paste is formed.

In use, the paste is applied to the substrate in a desired pattern by conventional coating techniques, typically silk screening. The paste is fired at an elevated temperature, above 600° C., and typically 750° C., to form the conductive element. The element thus formed is then allowed to cool to room temperature.

The foregoing and other objects, features and advantages of the invention will be apparent from the following more particular description of the preferred embodiments of the invention as illustrated in the accompanying drawings, wherein.

Figure 1:
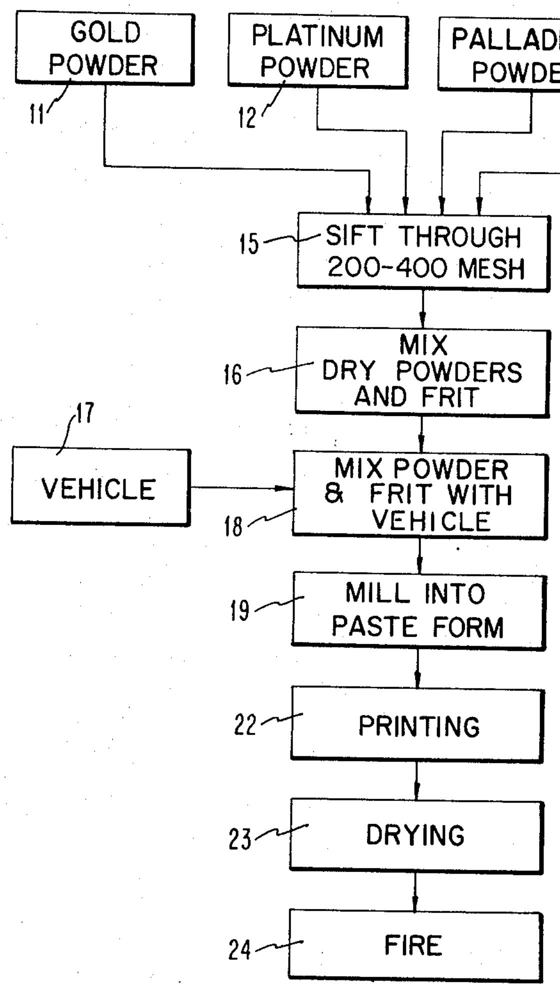
FIG. 1 is a flow diagram illustrating the materials used and the operations performed in fabricating a conductive element using the novel metallizing composition of the present invention.
Figure 2:
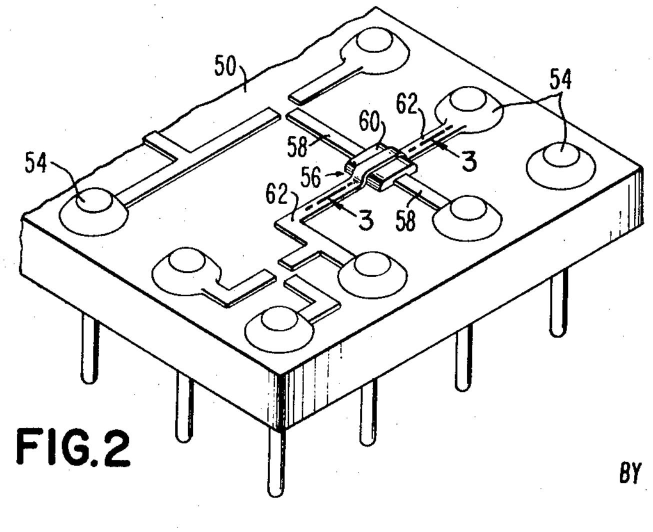
FIG. 2 is a fragmentary perspective view of a pattern of conductive elements on a ceramic substrate.

Referring now to the flow diagram of FIG. 1, there is given a summary of the method of fabricating a conductive element pattern such as shown in FIG. 2. Gold 11, platinum 12 and low surface area palladium 13 powders and vitreous frit 14 are sifted through a 200 to 400 mesh screen, typically 325 mesh, using gentle shaking as indicated by operation 15. Only powders passing through the screen are used in succeeding operations to avoid the presence of large particles.

The vitreous frit component 14 of the present invention is a finely divided glassy material which will fuse at the temperatures of firing. Preferably, the frit comprises bismuth trioxide and a lead borosilicate glass in a ratio of 2 parts of the former to one of the latter. The vitreous frit should be very finely divided both to insure excellent dispersion among the metal particles for uniformity and also to prevent clogging of the screen mesh. Preferred particle size of the frit is from 1 to 20 microns.

The dry metal powders together with the vitreous frit are then placed in a non-contaminating container and are uniformly mixed by shaking in operation 16. The uniformly mixed powders and frit are now ready to be mixed with the vehicle.

The vehicle used for the metallic powder preferably includes a gelation agent, a resinous binder, and a solvent. Examples of applicable gelation agents are hydrogenated castor oil, aluminum stearate and the like. The binder material is used to retain the powders and frit on the substrate when the solvent and gelation agent have been removed. Examples of binders include natural gums, synthetic resins, cellulose resinous materials and the like. The binder also imparts the desired viscosity to the printing paste. The solvent is selected so that it will dissolve the binder and will dissolve or disperse the gelation agent used in the vehicle. Commonly used solvents are the higher boiling paraffins, cycloparaffins and aromatic hydrocarbons or mixtures thereof; or one or more of the mono- and di-alkyl ethers of diethylene glycol or their derivatives such as diethylene glycol monobutyl ether acetate, butyl carbitol acetate and the like. The elements of the vehicle are premixed in solution before mixing with the metallic particles and vitreous frit.

The premixed metal powders and frit are combined with the inert vehicle together with a suitable surfactant such as nonyl phenoxy polyoxyethylene ethanol (Igepal CO430) and are thoroughly and homogeneously mixed until a paste of the desired viscosity is formed in operations 18 and 19. Standard mixing apparatus may be used such as a mortar and pestle, a blade-type mixer or the like. There is no need for attrition. The mixing operation 18 is needed only for homogeneity and to avoid breaking-out of metal powder in the subsequent milling operation. A second part of the mixing operation is the milling step 19. The three-roll mill is preferably used to further disperse the powders in the vehicle. The mill temperature should not be allowed to rise much above room temperature to avoid excessive volatilization of the vehicle. The paste is removed from the mill and now is ready for application to a substrate. In a typical embodiment, the paste comprises, in percentages by weight, 72.5% metals, 7.5% frit and 20% vehicle.

Thus far, one method for forming the metallizing composition has been described. Another method simply involves the addition of a suitable amount of low surface area palladium to commercially available gold-platinum pastes and mixing until the blend is completely homogeneous.

The paste is printed in a pattern 50 (FIG. 2) onto a dielectric substrate 52 by silk screening or other conventional printing processes in operation 22. The substrate is, of course, thoroughly cleaned and free from grease and other extraneous material before printing is attempted. A silk screen or mask having the desired circuit pattern is placed over the substrate. The paste is squeegeed, doctored, or extruded onto the screen. Pressure is applied to spread the paste through the screen and onto the substrate. The pattern in the screen is reproduced at a thickness determined by a number of variables, for example, squeegee pressure and angle, paste viscosity, screen openings, and mask thickness. In a typical embodiment the paste is printed to a thickness of 2 mils. The screen is removed from the substrate and the printed metallizing paste composition is ready to be dried and fired.

In operation 23, the printed pattern is dried. Most of the liquid is thereby removed and the resulting printed pattern is solid, having shrunk about 25% vertically, though not laterally, from its wet print dimensions. Typical drying conditions in air are at 100° C. for 15 minutes. Somewhat lower resistivities are noted in the case of printed lines of very narrow width when dried at lower temperatures for longer periods of time, but this is at the expense of slightly less adhesion to the underlying substrate.

Drying is followed by the firing operation 24. In the period during which the temperature of the printed paste on the substrate is gradually being increased to that of the firing temperature, the last traces of the solvent of the paste evaporate. As the temperature increases, the gelation agent and binder constituent in the vehicle completely pyrolyze and are substantially removed from the paste as gaseous combustion products. The vitreous frit fuses at the firing temperature to produce a durable fired conductive element pattern on the dielectric substrate, typically 1 mil thick. A preferred land thickness (after firing, but before tinning) is 15–25 microns. Above and below this range adhesion decreases. The firing temperature and time of firing, of course are largely dependent upon the particular vitreous frit used. Typically, however, firing is at approximately 725–800° C. in air, and preferably 750° C. Firing at much higher temperatures, e.g. 835° C., 900° C., can cause shrinkage, fissuring and lifting. But when lands previously fired at 750° C. are refired at higher temperatures, they remain dense, adherent and quite tinnable. Thus, if special process conditions require firing at temperatures above 750° C., a prefiring of 750° C. is recommended. No change in conductance or tinnability is observed with multiple firings at the same temperature or refiring at a higher temperature. In fact, refiring appears to increase adhesion. The dielectric substrate having the now fused pattern of conductive elements is brought to room temperature.

Subsequent to the preparation of the conductive element pattern 50 in FIG. 2, the pattern is solder tinned by immersion into a solder bath, for example 90% lead-10% tin, maintained at an elevated temperature, typically 625° F. for 8–10 seconds using rosin dissolved in isopropyl alcohol as a flux. Other solders, of course, can be used. The solder coats only the metallic pattern 50 and terminal pins 54. The solder coating insures a good electrical connection between the pins and the lands, i.e. those portions of the conductive element upon which a functional component is to be secured. Tht solder on the lands can also be used for the subsequent joining of active functional components, passive components, wires, other modules, etc. and for increasing the land conductance.

It is important that the conductive element pattern is not eroded by contact with the solder bath. The metallizing composition of the present invention is unusually resistant to erosion in the solder.

After the conductive elements are secured to the dielectric substrate and the tinning step completed as described above, the functional components such as transistors, diodes and the like are secured in their proper locations on the dielectric substrate. The passive components, resistors, capacitors and inductors may be secured to the substrate before (or after) tinning. Methods for accomplishing the securing of these passive and active functional components onto the substrate is more fully described in the patent applications, Ser. No. 300,855, filed Aug. 8, 1963, now U.S. Pat. 3,292,240 issued Dec. 20, 1966, and Ser. No. 300,734, filed Aug. 8, 1963, both of which are assigned to the same assignee as the present invention.

Figure 3:
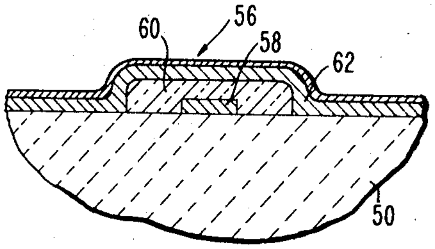
FIG. 3 is a cross-sectional illustration of the crossover of two conductive elements such as shown in FIG. 2.

FIG. 3 illustrates a cross-section of the two-conductor element crossover 56 included in the FIG. 2 conductive element pattern. To produce this structure, the conductive element 58 is first applied to the dielectric substrate 52 according to the procedure described above. After firing and cooling to room temperature, a discrete area 60 of dielectric vitreous frit, for example, a sodium aluminoborosilicate glass such as Corning 7052 glass manufactured by Corning Glass Works of Corning, N.Y., is screened over that portion of the conductive element 58 over which a second conductive element 62 is to be applied. The area 60 is typically 30 x 30 mils in area, and 1.5 to 3 mils thick for a 5 to 10 mil wide conductive element. The glass used in the vitreous frit might also be conveniently used in this screening operation. This vitreous frit coated area is then fired at the required temperature for fusing the frit and then cooled. The conductive electrode is then screened over the fused frit area, fired and cooled to room temperature to produce the crossover of two conductor elements as shown in 56. No apparent interaction is observed when the glass is screened over the previously formed land. Further, the subsequently deposited metallizing composition screens quite well and forms a dense, tinnable conductive path after firing.

It is believed that the present invention will be more fully appreciated in the light of the following series of examples.

In these examples, except where otherwise indicated, the paste comprises by weight, 72.5% of the metal component, 7.5% frit and 20% vehicle. The frit is 2 parts bismuth trioxide ($Bi_2O_3$) to one part of a lead borosilicate glass such as Drakenfeld 1527, manufactured by B. F. Drakenfeld & Co., Inc., of New York, N.Y.

The vehicle is 78 parts butyl carbitol acetate, 17 parts of an ethyl cellulose resin such as ethocel grade N10 to N100 manufactured by Hercules Powder Co., of Wilmington, Del., and 5 parts surfactant such as Igepal CO430, manufactured by Antara Division, General Aniline & Film Co. of New York, N.Y. Included also is a very small percentage, for example ½%, of a gelation agent such as Thixcin, manufactured by Baker Castor Oil Co. of Bayonne, N.J.

Drying is in air at 100° C. for 15 minutes. Firing is at 750° C. for 10–30 minutes.

METAL COMPONENT

The ratio of the noble metals in the metal component has a strong effect upon adhesion, conductivity, density and tinnability.

In Series I, all proportions are given in parts by weight.

| | Example | | | | | | | |
|---|---|---|---|---|---|---|---|---|
| | 1 | 2 | 3 | 4 | 5 | 6 | 7 | 8 |
| Ingredients: | | | | | | | | |
| Gold | 80 | 75 | 70 | 65 | 60 | 60 | 60 | 80 |
| Platinum | 0 | 20 | 20 | 20 | 20 | 15 | 10 | 20 |
| Palladium | 20 | 5 | 10 | 15 | 20 | 25 | 30 | 0 |

SERIES I.—EFFECT OF VARYING ALLOY RATIOS

| | Adhesion, p.s.i. | Resistance Ω/in. 10 mil wide line | |
|---|---|---|---|
| | | Untinned | Tinned |
| Example: | | | |
| 1 | 1,705 | 4.5 | 1.4 |
| 2 | 2,273 | 7.0 | 1.2 |
| 3 | 4,100 | 5.9 | 1.5 |
| 4 | 4,600 | 11.0 | 2.0 |
| 5 | 4,318 | 10.0 | 1.3 |
| 6 | 3,182 | 11.5 | 1.6 |
| 7 | 2,898 | 9.4 | 1.2 |
| 8 | 2,898 | 7.0 | 1.0 |

In the above examples, adhesion is measured in p.s.i. by a pull test (pulling a .150″ copper slug reflowed at 625° F. to a tinned dot of red paste at .02″/minute) while resistivity measurements are taken with a two point probe, on lines one inch long screened through 200 mesh and one mil thick emulsion.

An increase in gold content commonly increases conductivity. However, all the above examples are particularly resistant to erosion in solder, except that some erosion is noted in the case of Examples 1, 2, 3 and 8 in which the gold content equals or exceeds 70%. The effect of solder erosion is shown with more detail in Series II below.

Palladium concentrations from 10–20% (Examples 3–5) give good adhesion and density (i.e. no porosity or cracking) results. The increase in palladium content increases density. However, as palladium content is increased beyond 20%, i.e. Examples 6 and 7, adhesion and tinnability are decreased, probably due to formation of PdO. The platinum content increases cost with increase in concentration.

From the above considerations, 60% gold, 20% platinum, 20% palladium appears to be the optimum ratio. Very dense, tinnable leads are consistently obtained. All screened well.

SERIES II.—EFFECT OF IMMERSION IN SOLDER

| | Resistance Ω/in. 10 mil wide line | | | | | | |
|---|---|---|---|---|---|---|---|
| | | (Second dipped) | | | | | |
| | Untinned | 10 | +20 | +30 | +60 | +90 | +120 |
| Example: | | | | | | | |
| 1 | 4.5 | 1.8 | ------ | 1.8 | 2.1 | ------ | 2.6 |
| 2 | 7.5 | 1.15 | ------ | 1.20 | 1.20 | ------ | 1.25 |
| 3 | 6.0 | 1.65 | 1.35 | 1.35 | .95 | 1.30 | 1.20 |
| 4 | 9.0 | 1.10 | ------ | 1.30 | 1.35 | ------ | 1.35 |
| 5 | 8.75 | 1.35 | .85 | .85 | 1.10 | .91 | 1.00 |
| 6 | 11.5 | 1.70 | ------ | 1.70 | ------ | 1.65 | 1.40 |
| 7 | 8.5 | 1.25 | 1.18 | .85 | .90 | .91 | 1.15 |

In the above Series II, the metal component of each example has the same constituents as the corresponding example in Series I. Resistivity measurements are taken as in Series I, first of the untinned line. Then each line carrying substrate is immersed in 90% lead, 10% tin solder for 10 seconds and measured. Thereafter, the same lines are immersed in the solder for different lengths of time and the resistance measured after each dip. Thus, in Example 3, the line is immersed in solder 6 times for a total immersion time of 320 sec. Seven resistance measurements are made, including the measurement made when the land is untinned.

The results indicate that the lines are unusually resistant to solder erosion. Practically no erosion is apparent. In fact, any resistance changes seem due more to withdrawal rate than erosion. Some edge leaching is apparent in Examples 1–4 and 8, especially 1 and 8.

PALLADIUM SURFACE AREA

The physical properties of the powders can be varied with little noticeable difference, with one exception. The surface area of the palladium has an important effect upon adhesion and land density. In the next series of examples, the alloy component comprises 60% gold, 20% platinum, 20% palladium.

SERIES III.—VARYING PALLADIUM SURFACE AREA (B.E.T.)

| | Fired land properties | Adhesion, p.s.i. |
|---|---|---|
| Pd Surface Area ($M.^2$/gm.): | | |
| 1.3 | Good | 4,312 |
| 3.5 | do | 4,545 |
| 21.5 | Fissured | |
| 26.5 | do | 3,239 |

Little difference in adhesion is observed with different low surface area palladium powders, but high surface area palladium consistently gives rise to fissuring and much lower adhesion. Less than 4 $m.^2$/gm. is preferred.

Temperature effects upon adhesion

The adhesion of these fired tinned conductors are less susceptible to decrease during high temperature usage or wide temperature fluctuation than previous compositions. No change in adhesion is observed when samples of Example 5 above are tinned with 10 Sn:90 Pb solder and stored at 150° C. for 1000 hours. Samples of Example 8 similarly tinned decrease to 80% their original value.

Samples of Example 5 tinned as above and cycled from 0° C. to 125° C. for 1111 cycles decrease to 75% their original value. Samples of Example 8 similarly tinned decrease to 62% their original value.

FRIT COMPONENT

Figure 4:
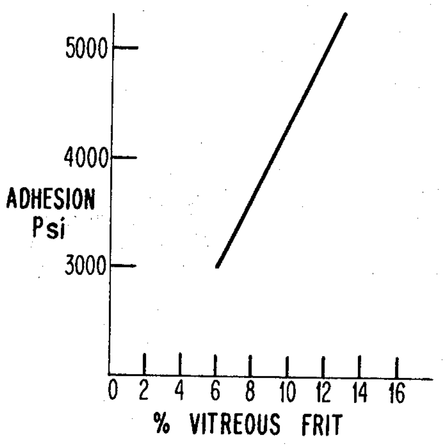
FIG. 4 is a plot of percentages, by weight, of vitreous frit or flux in the composition vs. adhesion.

As shown in FIG. 4, the amount of frit as a percentage of the total weight of the non-vehicle portion of the paste composition was varied from 4% to 13%, with a monatonic increase in adhesion with increase in flux. A preferred frit concentration is 7–9%, which provides excellent adhesion, adequate conductance and tinnability.

The above results may be summarized in the table below, which lists the materials and proportions of a preferred embodiment of the present invention, and the effects of changes in the various constituents. The table is given merely to facilitate the understanding of the invention and is not to be construed in a limiting sense.

.2% hydrogenated castor oil;
15.4% butyl carbitol acetate;
3.4% ethyl cellulose resin;
1.0% nonyl phenoxyl polyoxyethylene ethanol.

| Major constituents | Ratio within constituents | Material | Parts/weight of total composition | Effect of changes: Increase in concentration | Effect of changes: Variation in type |
|---|---|---|---|---|---|
| Metals, 72.5% | 60 | Gold | 43.5 | Increases conductance, erosion. | Large particles or flakes cause plating out on mill, lumps. |
| | 20 | Platinum | 14.6 | Increases cost, decreases adhesion. | Low surface area, less adhesion. High surface area, gelation, high viscosity. |
| | 20 | Paladium | 14.6 | 5-20% increases density, 20% decreases adhesion, tinnability. | High surface area, increases fissuring, gelation, lowers adhesion. |
| Vitreous Frit, 7.5% | 2 | $Bi_2O_3$ | 4.8 | Increases erosion, tinnability } Increases adhesion, Improves edges, Decreases tinnability. | |
| | 1 | Lead-borosilicate glass | 2.5 | Decreases erosion, tinnability } Increases adhesion, Improves edges, Decreases tinnability. | |
| Vehicle, 20% | | Gelation agent (hydrogenated castor oil). | .2 | Increases gelation, clogging mesh marks, edge effects. | |
| | | Solvent (butyl carbitol acetate). | 15.4 | Decreases viscosity | |
| | | Binder (ethyl cellulose resin). | 3.4 | Increases viscosity | |
| | | Surfactant (Igepal CO430) | 1.0 | Decreases viscosity, reduces clogging, improves flow edge effects. | |

While the invention has been particularly shown and described with reference to the preferred embodiments thereof, it will be understood by those skilled in the art that the foregoing and other various changes in form and details may be made therein without departing from the spirit and scope of the invention.

What is claimed is:

1. A metallizing composition adapted to be deposited and fired on an insulating substrate to form a conductive element thereon comprising:
- a metal mixture comprising finely divided powders of, gold 60–70%, platinum 10–20%, and palladium 10–30%;
- a vitreous frit component constituting between approximately 4 and 13% of the non-vehicle constituents of said composition; and
- an inert liquid vehicle in which said metal mixture and frit component are dispersed, forming the balance of said composition.

2. The composition according to claim 1 wherein said metal mixture comprises 60% gold, 20% platinum and 20% palladium.

3. The composition according to claim 1 wherein said vitreous frit component comprises bismuth trioxide and lead borosilicate glass in a ratio of two parts of the former to one of the latter.

4. The composition according to claim 1 wherein said vehicle comprises:
- 78% butyl carbitol acetate;
- 17% ethyl cellulose resin; and
- 5% nonyl polyoxyethylene ethanol to which is added a small percentage of hydrogenated castor oil.

5. A metallizing composition adapted to be deposited and fired on an insulating substrate to form a conductive element thereon comprising by weight:
- 43.5% gold;
- 14.6% platinum;
- 14.6% palladium;
- 4.8% bismuth trioxide;
- 2.5% sodium alumino-borosilicate glass;

6. The composition according to claim 1 wherein the surface area of said palladium is less than 4 m.$^2$/gm.

7. A conductor comprising:
- an insulating substrate; and
- a conductive element fused to the surface of said substrate comprising:
  - a metal component of, in parts by weight, gold 60–70%, platinum 10–20%, and palladium 10–30%, and
  - a vitreous frit constituting between approximately 4 and 13% of said element.

8. The method of forming a conductor which comprises:
- forming a metallizing composition comprising,
  - a metal component comprising finely divided powders of, in percentages by weight, gold 60–70%, platinum 10–20% and palladium 10–30%,
  - a vitreous frit constituting between approximately 4 and 13% of said element, and
  - a vehicle in which said metal and frit components are dispersed, the balance;
- applying said composition to an insulating substrate;
- firing said composition on said substrate at a temperature of between about 725° C. and 900° C. to form a conductive element; and,
- cooling to room temperature.

References Cited

UNITED STATES PATENTS

| | | | |
|---|---|---|---|
| 3,149,002 | 9/1964 | Place et al. | 117—227 |
| 3,216,834 | 11/1965 | Fitch | 106—1 |
| 3,290,171 | 12/1966 | Zollman et al. | 117—160 |
| 3,347,799 | 10/1967 | Wagner | 252—514 |
| 3,440,182 | 4/1969 | Hoffman | 252—514 |

ALLAN LIEBERMAN, Primary Examiner

U.S. Cl. X.R.

106—1, 171, 193; 117—212; 252—514